United States Patent
Jo et al.

(10) Patent No.: US 11,238,952 B2
(45) Date of Patent: Feb. 1, 2022

(54) MEMORY SYSTEM, MEMORY CONTROLLER, AND METHOD OF OPERATING MEMORY SYSTEM

(71) Applicant: SK hynix Inc., Icheon (KR)

(72) Inventors: Myung Jin Jo, Joyang (KR); Dae Sung Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/875,358

(22) Filed: May 15, 2020

(65) Prior Publication Data

US 2021/0193246 A1 Jun. 24, 2021

(30) Foreign Application Priority Data

Dec. 20, 2019 (KR) .................. 10-2019-0171470

(51) Int. Cl.
*G11C 29/42* (2006.01)
*G11C 29/50* (2006.01)
*G11C 29/12* (2006.01)
*G11C 29/44* (2006.01)

(52) U.S. Cl.
CPC ........ *G11C 29/42* (2013.01); *G11C 29/12005* (2013.01); *G11C 29/44* (2013.01); *G11C 29/50004* (2013.01)

(58) Field of Classification Search
CPC ... G11C 29/12005; G11C 29/42; G11C 29/44; G11C 29/50004
See application file for complete search history.

(56) References Cited

U.S. PATENT DOCUMENTS

| | | | |
|---|---|---|---|
| 8,694,854 B1* | 4/2014 | Dar | G11C 11/5642 714/763 |
| 2008/0077841 A1* | 3/2008 | Gonzalez | G11C 16/3422 714/763 |
| 2008/0158958 A1* | 7/2008 | Sokolov | G11C 16/26 365/185.08 |
| 2009/0043951 A1* | 2/2009 | Shalvi | G11C 16/34 711/103 |
| 2010/0091535 A1* | 4/2010 | Sommer | G11C 16/28 365/45 |
| 2017/0163288 A1* | 6/2017 | Tate | H03M 13/1137 |
| 2020/0218661 A1* | 7/2020 | Ryu | G06F 12/0873 |

FOREIGN PATENT DOCUMENTS

| KR | 10-2017-0097267 | 8/2017 |
|---|---|---|
| KR | 10-2019-0022987 | 3/2019 |

* cited by examiner

*Primary Examiner* — Tuan T Nguyen

(57) ABSTRACT

A memory system performs Error Correcting Code (ECC) decoding on data read from a plurality of target memory cells of a memory device, determines whether to update a read bias used in read operations of the memory device according to results of the ECC decoding, and then may update a value of the read bias based on result data produced by the ECC decoding and the number of data bits corrected by the ECC decoding, thereby optimizing the read bias value according to a change in a threshold voltage distribution of the memory cell, and increasing the likelihood of success of the ECC decoding.

16 Claims, 19 Drawing Sheets

FBR1 = (# of corrected bits from 0 to 1) / (# of bits programmed as 1)
FBR2 = (# of corrected bits from 1 to 0) / (# of bits programmed as 0)

FIG.12 value of σ

| P/E \ retention | R1(0 ~ 10) | R2(11 ~ 20) | R3(21 ~ 30) | R4(31 ~ 40) | ... |
|---|---|---|---|---|---|
| P1(0 ~ 10) | 0.1 | 0.15 | 0.2 | 0.25 | |
| P2(11 ~ 20) | 0.13 | 0.18 | 0.24 | 0.29 | |
| P3(21 ~ 30) | 0.18 | 0.23 | 0.28 | 0.34 | |
| P4(31 ~ 40) | 0.2 | 0.25 | 0.30 | 0.38 | |
| ... | | | | | |

MEMORY SYSTEM, MEMORY CONTROLLER, AND METHOD OF OPERATING MEMORY SYSTEM

CROSS REFERENCE TO RELATED APPLICATION

The present application claims priority under 35 U.S.C. 119(a) to Korean patent application number 10-2019-0171470, filed on Dec. 20, 2019, which is incorporated herein by reference in its entirety.

BACKGROUND OF THE INVENTION

1. Field of the Invention

Embodiments of the present disclosure relate to a memory system, a memory controller, and a method of operating the memory system.

2. Description of the Prior Art

A memory system which corresponds to a storage device is a device configured to store data on the basis of a request from a host, such as a computer, a mobile terminal (for example, a smartphone or a tablet), or various other electronic devices. The memory system may include a device configured to store data in a magnetic disk, such as a hard disk drive (HDD), or a device configured to store data in a nonvolatile memory, such as a solid state drive (SSD), a universal flash storage device (UFS), or an embedded MMC (eMMC) device.

The memory system may further include a memory controller for controlling the memory device. The memory controller may receive a command input from the host, and on the basis of the received command may execute or control operations for reading, writing, or erasing data in a volatile memory or a nonvolatile memory included in the memory system. The memory controller may execute firmware for performing a logical operation for executing or controlling such operations.

In a memory system including a nonvolatile memory, the threshold voltage distribution of a memory cell in which data is stored may deteriorate due to various factors. When the threshold voltage distribution of the memory cell deteriorates, an error may be more likely to occur when the memory system reads data.

SUMMARY OF THE INVENTION

Embodiments of the present disclosure may provide a memory system, a memory controller, and a method of operating the memory system, which can optimize a read bias value used to perform a read operation according to a change in a threshold voltage distribution of a memory cell. In addition, embodiments of the present disclosure may provide a memory system, a memory controller, and a method of operating the memory system, which can increase the likelihood of success of Error Correcting Code (ECC) decoding.

In one aspect, the embodiments of the present disclosure may provide a memory device and a memory system including a memory controller that controls the memory device.

The memory controller may performs Error Correcting Code (ECC) decoding on read data read from a plurality of target memory cells included in the memory device.

In response to the ECC decoding succeeding, the memory controller may determine whether to update one or more read biases used for reading data programmed into the plurality of target memory cells.

In response to determining to update the one or more read biases, the memory controller may update a read bias of the one or more read biases based on information regarding: i) result data generated by ECC decoding and ii) a number of data bits corrected during the ECC decoding.

When updating the read bias, the memory controller may determine a direction in which the read bias is updated based on a first fail bit rate and a second fail bit rate.

In this case, the memory controller may determine the first fail bit rate as a ratio of the number of data bits having a value of 1 among the result data to the number of data bits having a value corrected from 0 to 1 during the ECC decoding. In addition, the memory controller may determine the second fail bit rate as a ratio of the number of data bits having a value of 0 among the result data to the number of data bits having a value corrected from 1 to 0 during the ECC decoding.

When updating the read bias, the memory controller may determine a magnitude by which the read bias is updated based on a first standard deviation and a second standard deviation.

The first standard deviation may be an expected standard deviation for a threshold voltage distribution of a memory cell having a value of 1 among the target memory cells.

The second standard deviation may be an expected standard deviation for a threshold voltage distribution of a memory cell having a value of zero among the target memory cells.

The memory controller may determine the first standard deviation and the second standard deviation from among the plurality of standard deviations included in an expected standard deviation group based on a program-erase count of the target memory cells a retention time of the target memory cells, or both.

When the number of read biases is more than one, the memory controller may update each read bias based on information obtained by dividing the result data into a plurality of data groups corresponding to each read bias when updating that read bias.

The memory controller may determine to update the read bias every time the ECC decoding succeeds.

When the number of data bits corrected during the ECC decoding is greater than or equal to a predetermined threshold number of data bits, the memory controller may determine to update the read bias.

When a number of times a decoding operation is repeated during the ECC decoding is greater than or equal to a predetermined threshold number of iterations, the memory controller may determine to update the read bias.

In another aspect, embodiments of the present disclosure may provide a memory interface for communicating with a memory device and a memory controller including a control circuit for controlling the memory device.

The control circuit may perform Error Correcting Code (ECC) decoding on read data read from a plurality of target memory cells included in the memory device.

In response to the ECC decoding succeeding, the control circuit may determine to update one or more read biases used for reading data programmed in the plurality of target memory cells.

In response to determining to update the one or more read biases, the control circuit may update a read bias of the one or more read biases based on information regarding: i) result data generated by ECC decoding and ii) the number of data bits corrected during the ECC decoding.

When updating the read bias, the control circuit may determine a direction in which the read bias is updated based on a first fail bit rate and a second fail bit rate.

In this case, the control circuit may determine the first fail bit rate as a ratio of the number of data bits having a value of 1 among the result data to the number of data bits having a value corrected from 0 to 1 during the ECC decoding. In addition, the memory controller may determine the second fail bit rate as a ratio of the number of data bits having a value of 0 among the result data to the number of data bits having a value corrected from 1 to 0 during the ECC decoding.

When updating the read bias, the control circuit may determine a magnitude by which the read bias is updated based on a first standard deviation and a second standard deviation.

The first standard deviation may be an expected standard deviation for a threshold voltage distribution of a memory cell having a value of 1 among the target memory cells.

The second standard deviation may be an expected standard deviation for a threshold voltage distribution of a memory cell having a value of zero among the target memory cells.

The control circuit may determine the first standard deviation and the second standard deviation from among the plurality of standard deviations included in an expected standard deviation group based on a program-erase count of a target memory cells, a retention time of the target memory cells, or both.

A method of operating a memory system may include performing Error Correction Code (ECC) decoding on read data read from a plurality of target memory cells included in a memory device.

The method of operating the memory system may include determining whether to update one or more read biases used for reading data programmed in the plurality of target memory cells, in response to the ECC decoding succeeding.

The method of operating the memory system may include updating a read bias of the one or more read biases based on information regarding: i) result data generated by ECC decoding and ii) a number of data bits corrected during the ECC decoding, in response to determining to update the one or more read biases.

According to embodiments of the present disclosure, it is possible to optimize the read bias according to a change in the threshold voltage distribution of the memory cell.

In addition, according to embodiments of the present disclosure, it is possible to increase the likelihood of success of ECC decoding.

BRIEF DESCRIPTION OF THE DRAWINGS

The above and other aspects, features and advantages of the present disclosure will be more apparent from the following detailed description taken in conjunction with the accompanying drawings, in which:

FIG. 12 illustrates an example in which a memory system according to embodiments of the present disclosure determines a standard deviation according to a program-erase count and a retention time.

DETAIL DESCRIPTION

Hereinafter, embodiments of the present disclosure will be described in detail with reference to the accompanying drawings.

Figure 1:
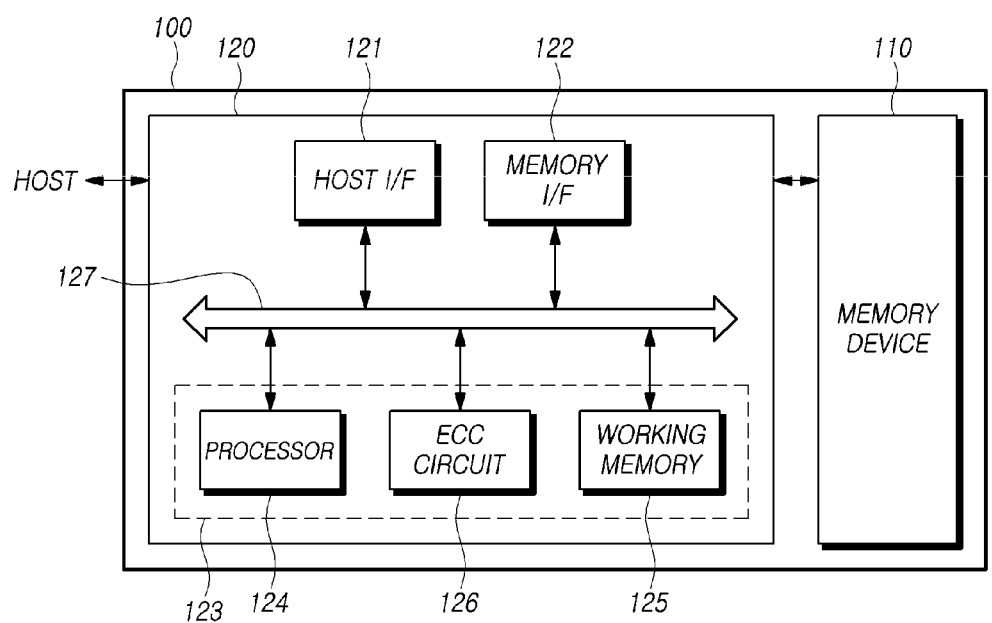
FIG. 1 illustrates a memory system according to an embodiment of the present disclosure.

FIG. 1 illustrates a memory system 100 according to an embodiment of the present disclosure.

The memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a "write operation"), an erasure operation, and the like.

The memory device 110 may include a memory cell array including multiple memory cells (also simply referred to as "cells") configured to store data. The memory cell array may exist inside a memory block.

For example, the memory device 110 may be implemented in various types, such as a double data rate synchronous dynamic random access memory (DDR SDRAM), a low power double data rate4 (LPDDR4) SDRAM, a graphics double data rate (GDDR) SDRAM, a low power DDR (LPDDR), a RAMBUS dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Embodiments of the present disclosure are applicable not only to a flash memory device having an electric charge storage layer configured as a conductive floating gate, but also to a flash memory device having a charge trap flash (CTF) having an electric charge storage layer configured as an insulating film.

The memory device 110 may be configured to receive a command and an address from the memory controller 120 and to access an area of the memory cell array selected by the address. That is, the memory device 110 may perform an operation corresponding to the received command in a memory area of the memory device having a physical address corresponding to the received address from the controller.

For example, the memory device 110 may perform a program operation, a read operation, an erasure operation, and the like. In relation thereto, during the program operation, the memory device 110 may program data in the area selected by the address. During the read operation, the memory device 110 may read data from the area selected by the address. During the erasure operation, the memory device 110 may erase data stored in the area selected by the address.

The memory controller 120 may control write (program), read, erasure, and background operations with regard to the memory device 110. The background operation may include, for example, at least one among a garbage collection operation (GC), a wear leveling (WL) operation, and a bad block management (BBM) operation.

The memory controller 120 may control the operation of the memory device 110 at the request of a host. Alternatively, the memory controller 120 may control the operation of the memory device 110 without a corresponding request of the host, such as, for example, when it performs one or more background operations of the memory device.

The memory controller 120 and the host may be separate devices. In some cases, the memory controller 120 and the host may be integrated and implemented as a single device. In the following description, the memory controller 120 and the host are assumed to be separate devices.

The memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to a control of the control circuit 123.

The control circuit 123 may be configured to control the operation of the memory device 110 by performing operations for an overall control of the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods may include a page mapping method, a block mapping method, and a hybrid mapping method.

The processor 124 may be configured to randomize data received from the host HOST. For example, the processor 124 may randomize data received from the host HOST by using a randomizing seed. The randomized data is provided to the memory device 110 as data to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) so as to control the operation of the memory controller 120. In other words, the processor 124 may control the overall operation of the memory controller 120 and, in order to perform a logical operation, may execute (drive) firmware loaded into the working memory 125 during booting.

The firmware refers to a program executed inside the memory system 100, and may include various functional layers.

For example, the firmware may include at least one of a flash translation layer (FTL) configured to translate between a logical address that the host HOST requests the memory system 100 to provide and a physical address of the memory device 110, a host interface layer (HIL) configured to interpret a command that the host HOST issues to the memory system 100 (storage device) and to deliver the same to the FTL, and a flash interface layer (FIL) configured to deliver a command issued by the FTL to the memory device 110.

The firmware may be stored in the memory device 110, and then loaded into the working memory 125.

The working memory 125 may store firmware, program codes, commands, or pieces of data necessary to drive the memory controller 120. The working memory 125 may include, for example, at least one among a static RAM (SRAM), a dynamic RAM (DRAM), and a synchronous DRAM (SDRAM) as a volatile memory.

The error detection/correction circuit 126 may be configured to detect an error bit of check target data by using an error correction code, and to correct the detected error bit. The check target data may be data stored in the working memory 125, data retrieved from the memory device 110, or the like.

The error detection/correction circuit 126 may be implemented to decode data by using the error correction code. The error detection/correction circuit 126 may be implemented using various code decoders. For example, the error detection/correction circuit 126 may use a decoder that performs nonsystematic code decoding or a decoder that performs systematic code decoding.

For example, the error detection/correction circuit 126 may detect an error bit, sector by sector, with regard to each piece of read data. That is, each piece of read data may include multiple sectors. As used herein, a sector may refer to a data unit smaller than the read unit (page) of a flash memory. Sectors constituting each piece of read data may correspond to each other via an address.

The error detection/correction circuit 126 may calculate a bit error rate (BER) and determine whether or not correction can be made on a sector by sector basis. If the BER for a sector is higher than a reference value, the error detection/correction circuit 126 may determine that the sector is uncorrectable or "a fail". If the BER for the sector is lower than the reference value, the error detection/correction circuit 126 may determine that the sector is correctable or "a pass".

The error detection/correction circuit 126 may perform error detection and correction operations successively with regard to all pieces of read data. When a sector included in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may in the end detect a sector deemed uncorrectable. There may be one or more sectors deemed uncorrectable. The error detection/correction circuit 126 may deliver information (for example, address information) regarding the sectors deemed uncorrectable to the processor 124.

The bus 127 may be configured to provide a channel between the constituent elements 121, 122, 124, 125, and 126 of the memory controller 120. The bus 127 may include, for example, a control bus for delivering various kinds of control signals and commands, and a data bus for delivering various kinds of data.

The above-mentioned constituent elements 121, 122, 124, 125, and 126 of the memory controller 120 are only provided as examples. It is noted that some of the above-mentioned constituent elements 121, 122, 124, 125, and 126 of the memory controller 120 may be omitted, or some of the above-mentioned constituent elements 121, 122, 124, 125, and 126 of the memory controller 120 may be integrated into a single element. Also, in some cases, one or more other constituent elements may be added, in addition to the above-mentioned constituent elements of the memory controller 120.

Hereinafter, the memory device 110 will be described in more detail with reference to FIG. 2.

Figure 2:
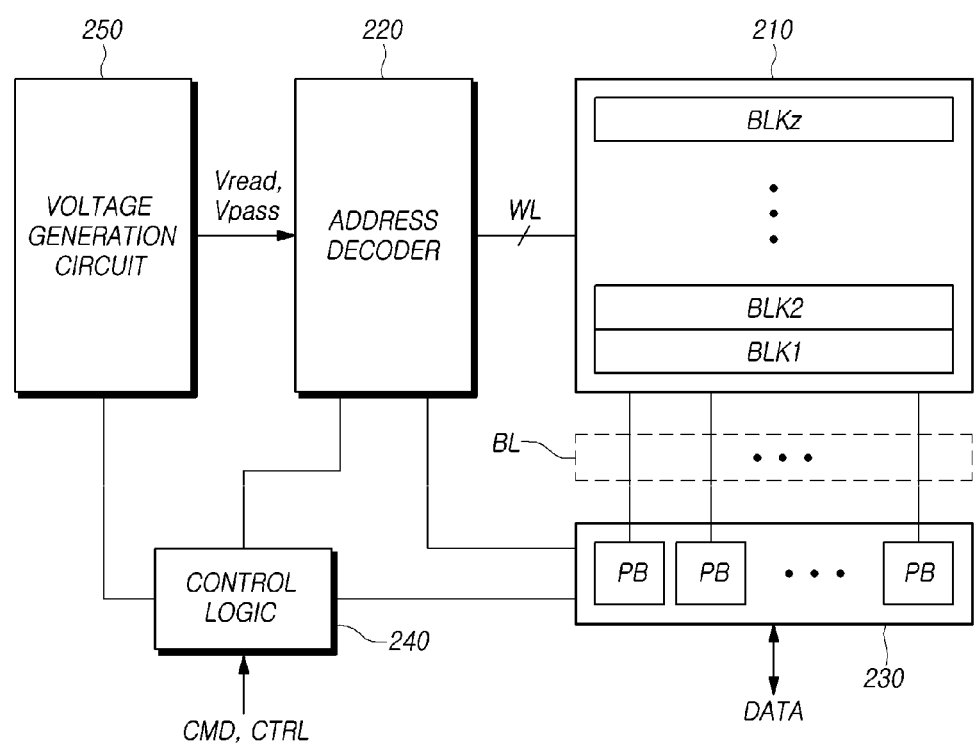
FIG. 2 illustrates a memory device according to an embodiment of the present disclosure.

FIG. 2 is a block diagram schematically illustrating a memory device 110 according to an embodiment of the present disclosure.

The memory device 110 according to an embodiment of the present disclosure may include a memory cell array 210, an address decoder 220, a read/write circuit 230, a control logic 240, and a voltage generation circuit 250.

The memory cell array 210 may include multiple memory blocks BLK1-BLKz (where z is a natural number equal to or larger than 2).

In the multiple memory blocks BLK1-BLKz, multiple word lines WL and multiple bit lines BL may be disposed, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells, and may include nonvolatile memory cells having a vertical channel structure.

The memory cell array 210 may be configured as a memory cell array having a two-dimensional structure and, in some cases, may be configured as a memory cell array having a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data. As another example, each of the multiple memory cells included in the memory cell array 210 may be a triple-level cell (TLC) configured to store three bits of data. As another example, each of the multiple memory cells included in the memory cell array 210 may be a quad-level cell (QLC) configured to store four bits of data. As another example, the memory cell array 210 may include multiple memory cells, each of which may be configured to store at least five bits of data.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to a control of the control logic 240.

The address decoder 220 may receive addresses through an input/output buffer inside the memory device 110. The address decoder 220 may be configured to decode a block address among the received addresses. The address decoder 220 may select at least one memory block according to the decoded block address.

The address decoder 220 may receive a read voltage Vread and a pass voltage Vpass from the voltage generation circuit 250.

The address decoder 250 may apply the read voltage Vread to a selected word line WL inside a selected memory block, during an operation of applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line according to the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that is in charge of a data processing function and, in some cases, may further include a cache buffer in charge of a caching function.

The multiple page buffers PB may be connected to the memory cell array 210 through the multiple bit lines BL. In order to sense the threshold voltage Vth of the memory cells during a read operation and a program verification operation, the multiple page buffers PB may continuously supply a sensing current to the bit lines BL connected to the memory cells, may sense, through a sensing node, a change in the amount of current that flows according to the program state of a corresponding memory cell, and may latch the same as sensing data.

The read/write circuit 230 may operate in response to page buffer control signals output from the control logic 240.

During a read operation, the read/write circuit 230 senses data in a memory cell, temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the pre-charge potential level of sensing nodes of multiple page buffers PB.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240. The read voltage Vread may correspond to one of a one or more read biases used to read the cells.

Figure 3:
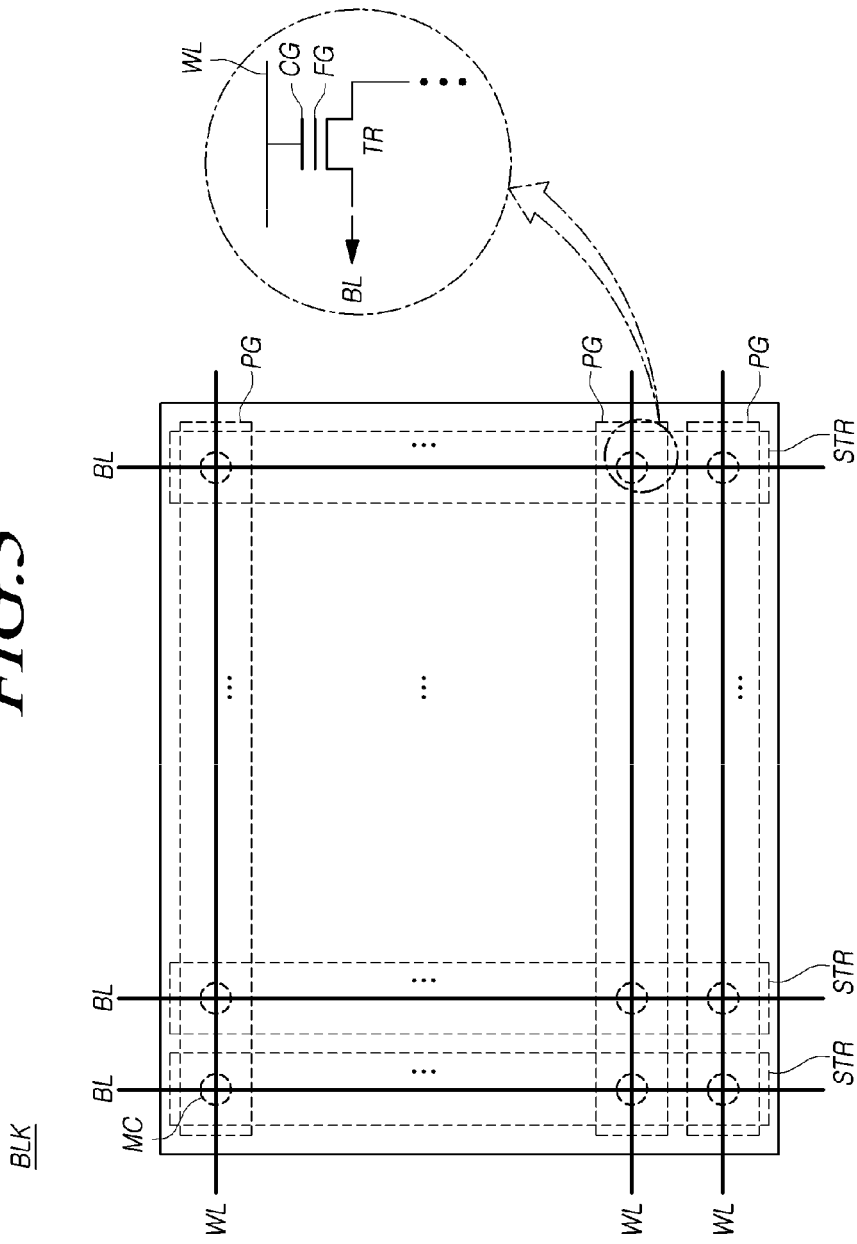
FIG. 3 illustrates a memory block of a memory device according to an embodiment of the present disclosure.

FIG. 3 is a diagram schematically illustrating a memory block BLK of a memory device 110 according to an embodiment of the present disclosure.

Referring to FIG. 3, a memory block BLK included in the memory device 110 may be arranged and configured in such a direction that multiple pages PG and multiple strings STR intersect.

The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

The multiple word lines WL and the multiple bit lines BL may intersect with each other, and multiple memory cells MC may be respectively defined at the intersections of the word lines WL and bit lines BL. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

In the case of a memory block structure as illustrated in FIG. 3, a read operation and a program operation (write operation) may be performed page by page, and an erasure operation may be performed memory block by memory block.

Figure 4:
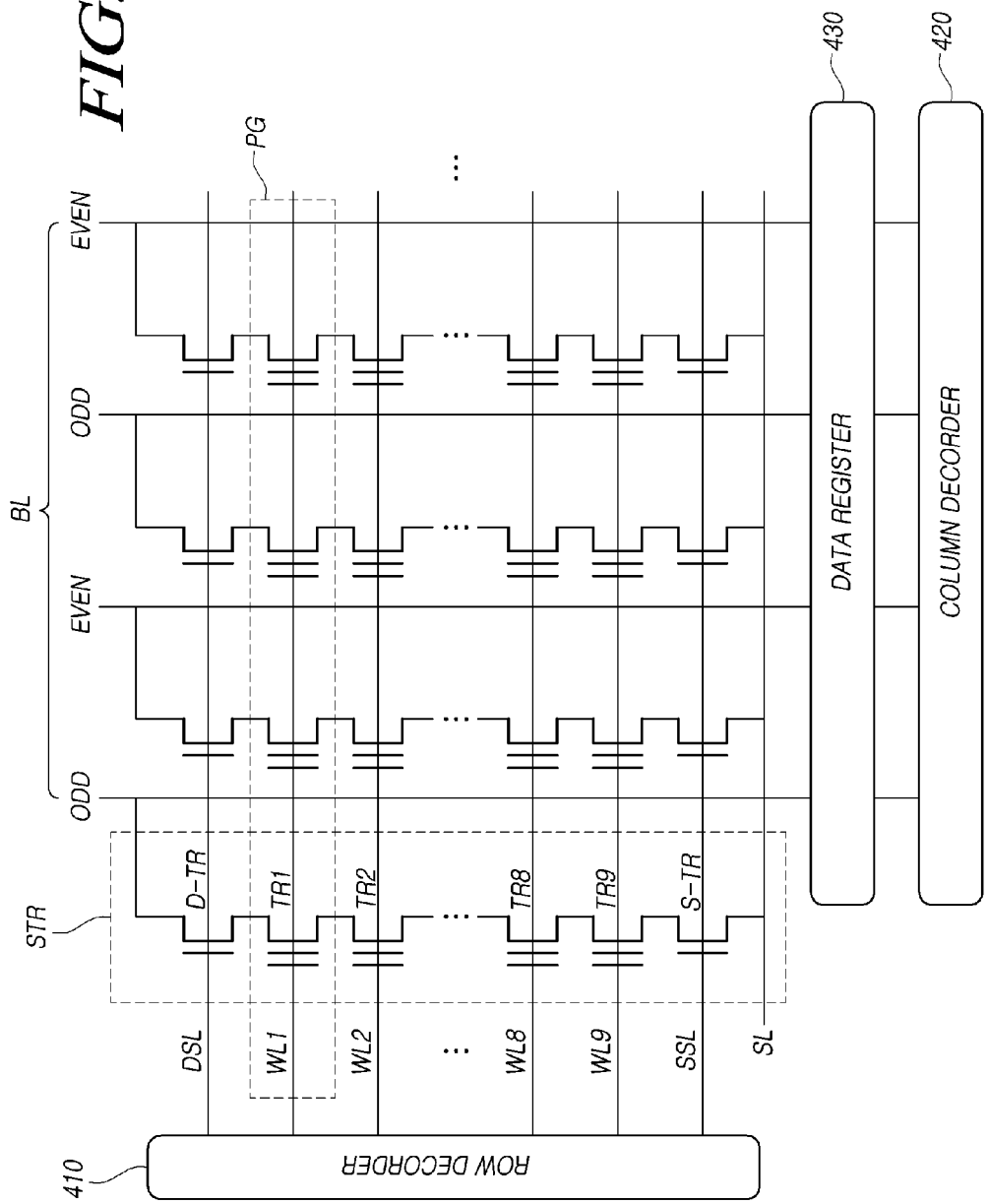
FIG. 4 illustrates the structure of word lines and bit lines of a memory device according to an embodiment of the present disclosure.

FIG. 4 is a diagram illustrating a structure of word lines WL and bit lines BL of a memory device 110 according to an embodiment of the present disclosure.

Referring to FIG. 4, the memory device 110 has a core area in which memory cells MC are concentrated, and an auxiliary area which corresponds to the remaining area other than the core area. Circuits in the auxiliary area support the operations of the memory cell array 210.

The core area may include pages PG and strings STR. In the core area, multiple word lines WL1-WL9 and multiple bit lines BL are arranged to intersect.

The word lines WL1-WL9 may be connected to a row decoder 410. The bit lines BL may be connected to a column decoder 420. A data register 430, which corresponds to the read/write circuit 230 of FIG. 2, may exist between the multiple bit lines BL and the column decoder 420.

The multiple word lines WL1-WL9 may correspond to multiple pages PG.

In an embodiment, each of the multiple word lines WL1-WL9 may correspond to one page PG as illustrated in FIG. 4. In another embodiment, wherein each of the multiple word lines WL1-WL9 has a large size, each of the multiple word lines WL1-WL9 may correspond to at least two (for example, two or four) pages PG. Each page PG is the smallest unit operated on when conducting a program operation or a read operation, and all memory cells MC within the same page PG may perform simultaneous operations when conducting a program operation or a read operation.

The multiple bit lines BL may be connected to the column decoder 420, and may be distinguished between odd-numbered bit lines BL and even-numbered bit lines BL.

To access a memory cell MC, the address may be entered to the core area first through the input/output end and then through the row decoder 410 and the column decoder 420 such that a corresponding target memory cell can be designated. As used herein, designating a target memory cell refers to accessing one of the memory cells MC at the sites of intersection between the word lines WL1-WL9 connected to the row decoder 410 and the bit lines BL connected to the column decoder 420, for programming data therein or for reading programmed data therefrom.

Pages PG in a first direction (for example, X-axis direction) are bound by a commonly used line referred to as a word line WL, and strings STR in a second direction (for example, Y-axis direction) are bound (connected) by a common line referred to as a bit line BL. As used herein, being commonly bound refers to being structurally connected by the same material and simultaneously receiving the same voltage during voltage application. The voltage applied to a memory cell MC in the middle position or last position among memory cells MC connected in series may slightly differ from the voltage applied to the memory cell MC in the first position and from the voltage applied to the memory cell MC in the last position, due to the voltage drop across the preceding memory cell MC.

The data register 430 plays an essential role because all data processing by the memory device 110, including program and read operations, occurs via the data register 430. If data processing by the data register 430 is delayed, all the other areas need to wait until the data register 430 finishes the data processing. In addition, degradation of performance of the data register 430 may degrade the overall performance of the memory device 110.

Referring to FIG. 4, in one string STR, multiple transistors TR1, TR2, ..., TR8, TR9 connected to multiple word lines WL1, WL2, ..., WL8, WL9 may exist. The multiple transistor TR1-TR9 correspond to respective memory cells MC. As used herein, the multiple transistors TR1-TR9 refer to transistors including control gates CG and floating gates FG.

The multiple word lines WL1-WL9 include two outermost word lines WL1 and WL9. A first selection line DSL may be additionally arranged outside the first outermost word line WL1, which is closer to the data register 430 in terms of the signal path among the two outermost word lines WL1 and WL9, and a second selection line SSL may be additionally arranged outside the other second outermost word line WL9.

The first selection transistor D-TR, which is controlled to be turned on or off by the first selection line DSL, has a gate electrode connected to the first selection line DSL, but in an embodiment do not include a floating gate FG. The second selection transistor S-TR, which is controlled to be turned on or off by the second selection line SSL, has a gate electrode connected to the second selection line SSL, but in an embodiment do not include a floating gate FG.

The first selection transistor D-TR plays the role of a switch that turns on or off the connection between the corresponding string STR and the data register 430. The second selection transistor S-TR plays the role of a switch that turns on or off the connection between the corresponding string STR and the source line SL. That is, the first selection transistor D-TR and the second selection transistor S-TR play the role of gatekeepers which are positioned on both ends of the corresponding string STR and operate to convey or block signals.

The memory system 100 needs to provide the target memory cell MC of the bit line BL to be programmed with electrons during a program operation. Accordingly, the memory system 100 applies a predetermined turn-on voltage Vcc to the gate electrode of the first selection transistor D-TR, thereby turning on the first selection transistor D-TR, and applies a predetermined turn-off voltage (for example, 0V) to the gate electrode of the second selection transistor S-TR, thereby turning off the second selection transistor S-TR.

The memory system 100 turns on both the first selection transistor D-TR and the second selection transistor S-TR during a read operation or a verification operation. Accordingly, an electric current may flow through the corresponding string STR and drain into the source line SL, which may correspond to the ground during the read operation, such that the voltage level of the bit line BL can be measured. However, during a read operation, there may be a time difference in on/off timing between the first selection transistor D-TR and the second selection transistor S-TR.

The memory system 100 may supply a predetermined voltage (for example, +20V) to the substrate through a source line SL during an erasure operation. The memory system 100 floats both the first selection transistor D-TR and the second selection transistor S-TR during an erasure operation, thereby generating an infinite resistance. As a result, the role of the first selection transistor D-TR and that of the second selection transistor S-TR may be eliminated, and electrons may flow only between the floating gate FG and the substrate due to the potential difference.

Figure 5:
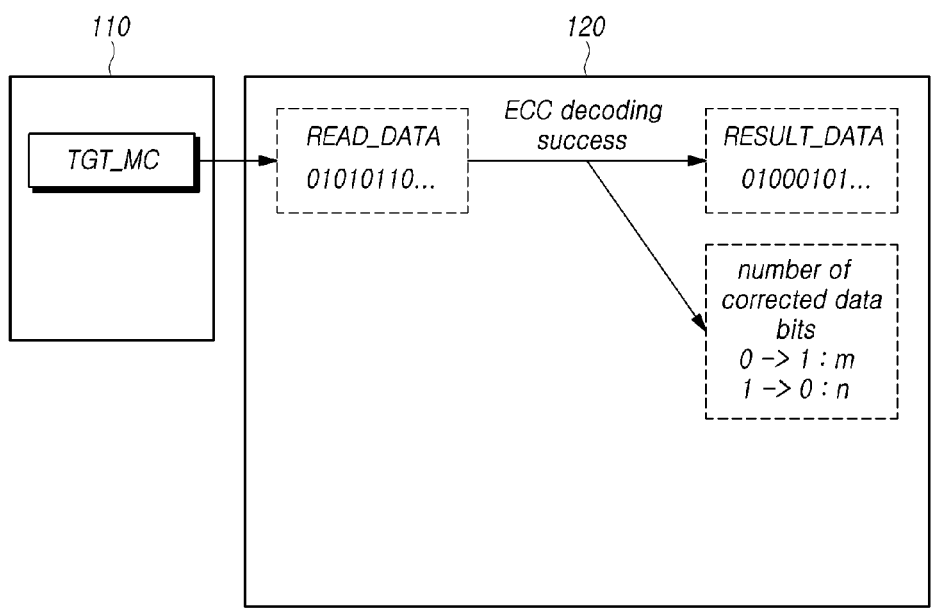
FIG. 5 illustrates operation of a memory system according to embodiments of the present disclosure.

FIG. 5 illustrates operation of the memory system 100 according to embodiments of the present disclosure.

The memory controller 120 of the memory system 100 may execute ECC decoding on read data READ_DATA read from a plurality of target memory cells TGT_MC included in the memory device 110. ECC decoding may be performed in units of sectors by the error detection/correction circuit 126 described in FIG. 1.

If the ECC decoding succeeds, that is, if an uncorrectable ECC (UECC) does not occur, information on result data RESULT_DATA and the number of data bits corrected during the ECC decoding may be generated.

The result data RESULT_DATA may have a change in some data bits compared to the read data READ_DATA. During the ECC decoding, the value of some of data bits having a value of 1 may be corrected to 0, and the value of some of data bits having a value of 0 may be corrected to 1. If there is no error, no correction may occur during the ECC decoding.

The information on the number of data bits corrected during the ECC decoding may include an indication m of a number of data bits having a value corrected from 0 to 1 and an indication n of a number of data bits having a value corrected from 1 to 0. At this time, the values of m and n are integers greater than or equal to 0.

Figure 6:
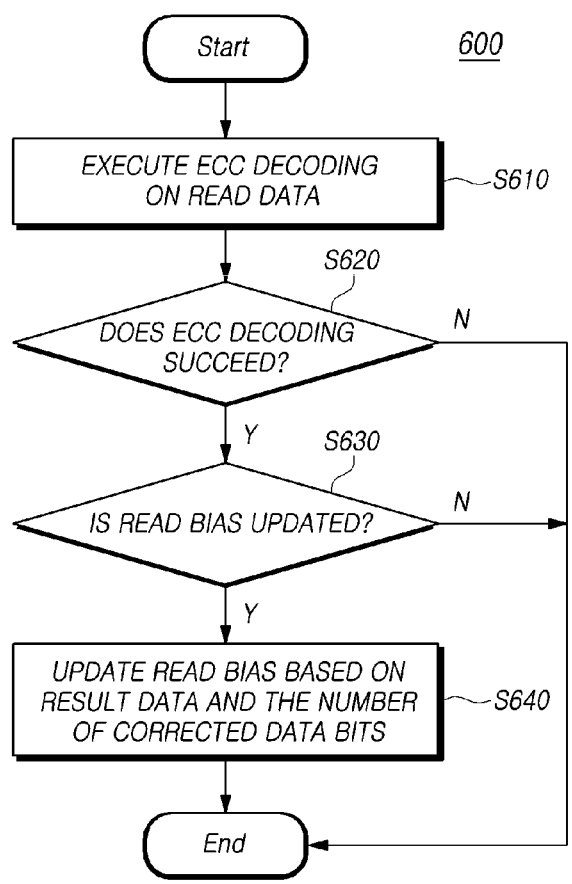
FIG. 6 illustrates a process for operating a memory system according to embodiments of the present disclosure.

FIG. 6 is a flowchart illustrating a process 600 for operating the memory system 100 according to embodiments of the present disclosure.

First, in operation S610, the memory controller 120 of the memory system 100 may execute ECC decoding on read data READ_DATA read from a plurality of target memory cells TGT_MC included in the memory device 110.

In operation S620, the memory controller 120 may determine whether the ECC decoding of the read data READ_DATA succeeds. When the ECC decoding succeeds, the process 600 proceeds to operation S630; otherwise the process 600 exits.

When the ECC decoding succeeds (S620-Y), in operation S630, the memory controller 120 may determine whether to update a read bias. In an embodiment, the process 600 determines to update the read bias every time the ECC decoding succeeds. In another embodiment, the process 600 determines to update the read bias when a total number of bits corrected by the ECC decoding exceeds a corrected bit threshold. In another embodiment, the process 600 determines to update the read bias when a total number of iterations performed during the ECC decoding exceeds an iteration threshold.

The read bias is a value used to read data programmed into the plurality of target memory cells TGT_MC. There may be one or more read biases. If the target memory cell TGT_MC is a single-level cell SLC, there may be one read bias used to read the target memory cell TGT_MC; if the target memory cell TGT_MC is a multi-level cell MLC, there may be three read biases used to read the target memory cell TGT_MC; and if the target memory cell TGT_MC is a triple-level cell TLC, there may be seven read biases used to read the target memory cell TGT_MC.

When updating the read bias (S630-Y), in operation S640, the memory controller 120 may update the read bias based on information regarding: i) the result data RESULT_DATA generated by ECC decoding and ii) the number of data bits corrected during the ECC decoding.

In embodiments of the present disclosure, when the ECC decoding succeeds, the memory controller 120 may update the read bias. This is because, when the ECC decoding succeeds, the memory controller 120 determines a pattern in which an error occurs in a process of read data READ_DATA, and then deals with the pattern in advance. Updating the read bias this way can increase the likelihood of success in future ECC decoding.

When the memory controller 120 of the memory system 100 updates the read bias as described above, it is necessary to determine a direction in which the read bias is updated and a magnitude by which the read bias is updated.

The direction in which the read bias is updated refers to whether the value of the read bias increases or decreases relative to a currently configured value of the read bias.

The magnitude in which the read bias is updated refers to an absolute value indicating how much the value of the read bias increases or decreases from the currently configured value.

First, an embodiment in which the memory controller 120 of the memory system 100 determines a direction in which the read bias is updated will be described.

The memory controller 120 may determine the direction in which the read bias is updated based on a first fail bit rate FBR1 and a second fail bit rate FBR2.

The memory controller 120 may determine the first fail bit rate FBR1 as a ratio of the number of data bits having a value of 1 among the result data RESULT_DATA to the number of data bits having a value corrected from 0 to 1 during the ECC decoding.

The memory controller 120 may determine the second fail bit rate FBR2 as a ratio of the number of data bits having a value of 0 among the result data RESULT_DATA to the number of data bits having a value corrected from 1 to 0 during the ECC decoding.

Figure 7:
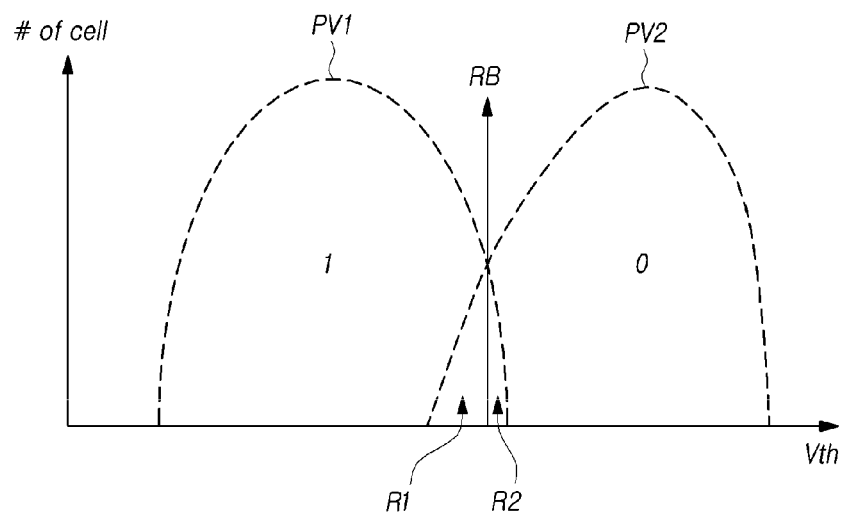
FIG. 7 illustrates an example in which a memory system according to embodiments of the present disclosure determines a first fail bit rate and a second fail bit rate.

FIG. 7 is a diagram illustrating an example in which the memory system 100 according to embodiments of the present disclosure determines the first fail bit rate FBR1 and the second fail bit rate FBR2.

It is assumed that a threshold voltage distribution of memory cells programmed as a value of 1 is PV1 and a threshold voltage distribution of memory cells programmed as a value of 0 is PV2 among the above-described target memory cells TGT_MC. The threshold voltage distribution of the memory cells may be a symmetric distribution such as PV1 or an asymmetric distribution such as PV2.

Meanwhile, among the target memory cells TGT_MC, the number of memory cells programmed as a value of 1 and the number of memory cells programmed as a value of 0 may be different.

When the ECC decoding succeeds, the number of memory cells programmed as a value of 1 will be equal to the number of data bits having a value of 1 among the result data RESULT_DATA, and the number of memory cells programmed as a value of 0 will be equal to the number of data bits having a value of 0 among the result data RESULT_DATA. This is because when the data programmed in the memory cell and the data read in the read process are different from each other, this is corrected during the ECC decoding.

A value of a read bias RB for reading data programmed into the target memory cells TGT_MC may be located between the threshold voltage distribution PV1 and the threshold voltage distribution PV2 in an ideal case.

However, when the threshold voltage distribution of the target memory cells TGT_MC has deteriorated due to various causes, the threshold voltage distribution PV1 and the threshold voltage distribution PV2 may overlap as shown in FIG. 7. In this case, the value of the read bias RB may be determined as any one value in a threshold voltage section where the threshold voltage distribution PV1 and the threshold voltage distribution PV2 overlap.

In this case, there may exist a memory cell having bit values of data read using the read bias RB that may differ from the programmed value of the memory cell.

In one case, at the time of an initial reading from a memory cell from among the memory cells programmed as a value of 1, the memory cell may have a threshold voltage greater than or equal to the read bias RB (that is, the threshold voltage is in region R2), and as a result a value of the data bit of the memory cell may be read as zero. The value of the data bit read from this memory cell may then be corrected from 0 to 1 during the ECC decoding.

In another case, at the time of an initial reading from a memory cell from among the memory cells programmed as a value of 0, the memory cell may have a threshold voltage less than or equal to the read bias RB (that is, the threshold voltage is in region R1), an as a result a value of the data bit may be read as 1. The value of the data bit read from this memory cell may then be corrected from 1 to 0 during the ECC decoding.

The memory controller 120 may update the value of the read bias RB to reduce the number of data bits having a value corrected from 0 to 1 or corrected from 1 to 0 during the ECC decoding. This is because, if the number of data bits to be corrected is large, the time required for the ECC decoding may be long or UECC may occur.

If a ratio of data bits corrected from 0 to 1 during the ECC decoding (i.e., a first fail bit rate FBR1 as shown in FIG. 7) is higher than a ratio of data bits corrected from 1 to 0 (i.e., a second fail bit rate FBR2 as shown in FIG. 7), the memory controller 120 may increase the value of the read bias RB relative to the currently configured value to reduce the number of data bits corrected from 0 to 1.

If the ratio of data bits corrected from 0 to 1 during the ECC decoding (i.e. the first fail bit rate FBR1) is lower than the ratio of data bits corrected from 1 to 0 (i.e., the second fail bit rate FBR2), the memory controller 120 may reduce the value of the read bias RB relative to the currently configured value to reduce the number of data bits corrected from 1 to 0.

If the ratio of data bits corrected from 0 to 1 and the ratio of data bits corrected from 1 to 0 are the same during the ECC decoding, the memory controller 120 may maintain the value of the read bias RB at the currently configured value.

Hereinafter, an example in which the memory controller 120 of the memory system 100 determines a direction in which a read bias is updated according to the first fail bit rate FBR1 and the second fail bit rate FBR2 will be described with reference to FIGS. 8 and 9.

Figure 8:
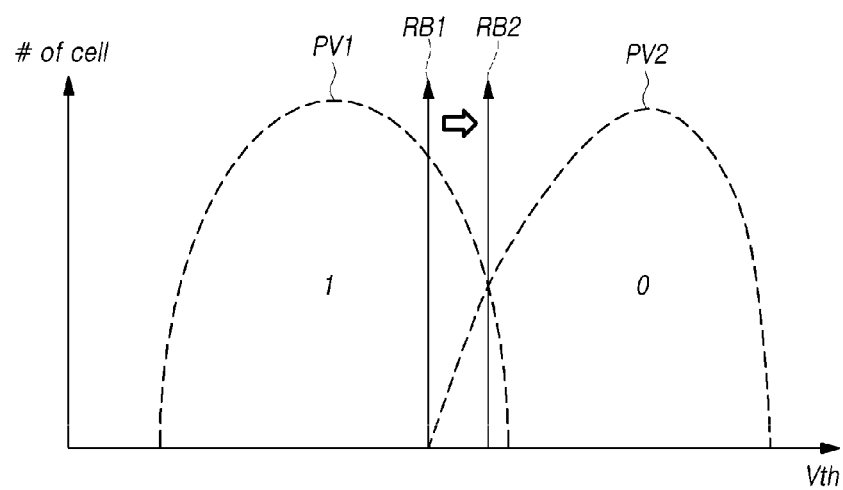
FIG. 8 illustrates an example in which a memory system according to embodiments of the present disclosure determines a direction in which a read bias is updated according to a first fail bit rate and a second fail bit rate.

FIG. 8 is a diagram illustrating an example in which the memory system 100 according to embodiments of the present disclosure determines a direction in which a read bias is updated according to the first fail bit rate FBR1 and the second fail bit rate FBR2.

In FIG. 8, it is assumed that the value of the current read bias is configured as RB1.

If the first fail bit rate FBR1 is greater than the second fail bit rate FBR2 when the ECC decoding succeeds, the memory controller 120 may increase the value of the read bias from RB1 to RB2 in order to reduce the number of data bits having a value corrected from 0 to 1.

When the value of the read bias is RB1, the number of memory cells in which the value of the data bit is read as zero among memory cells programmed as a value of 1 may be increased relative to when the value of the read bias is RB2. Therefore, the memory controller 120 may increase the value of the read bias to RB2 to reduce the number of memory cells read as 0 among the memory cells programmed as a value of 1.

Figure 9:
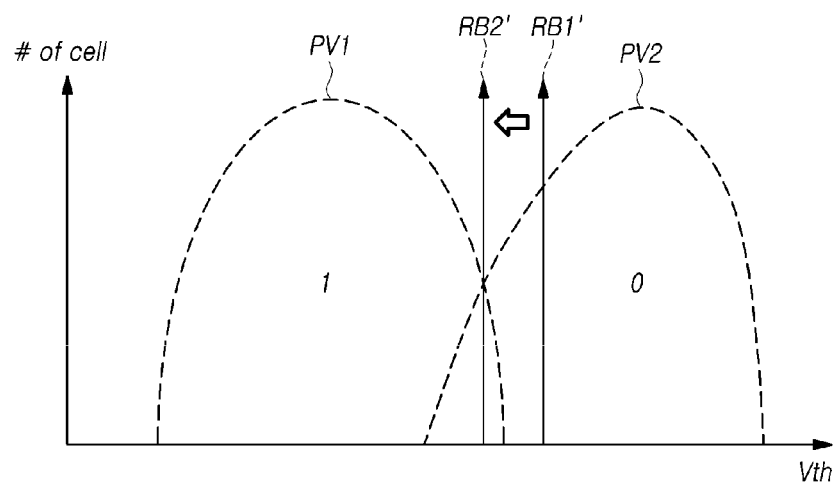
FIG. 9 illustrates another example in which a memory system according to embodiments of the present disclosure determines a direction in which a read bias is updated according to a first fail bit rate and a second fail bit rate.

FIG. 9 is a diagram illustrating another example in which the memory system 120 according to embodiments of the present disclosure determines a direction in which a read bias is updated according to the first fail bit rate FBR1 and a second fail bit rate FBR2.

In FIG. 9, it is assumed that a value of a current read bias is configured as RB1'.

If the first fail bit rate FBR1 is smaller than the second fail bit rate FBR2 when the ECC decoding succeeds, the memory controller 120 may reduce the value of the read bias from RB1' to RB2' in order to reduce the number of data bits having a value corrected from 1 to 0.

When the value of the read bias is RB1', the number of memory cells in which the value of the data bit is read as one among memory cells programmed as a value of 0 may be increased relative to when the value of the read bias is RB2'. Therefore, the memory controller 120 may reduce the value of the read bias to RB2' to reduce the number of memory cells read as 1 among the memory cells programmed as a value of 0.

The first fail bit rate FBR1 and the second fail bit rate FBR2 described above with reference to FIGS. 8 to 9 may be used when the memory controller 120 determines whether to increase or reduce the value of the read bias, that is, a direction in which the read bias is changed.

Hereinafter, an embodiment in which the memory controller 120 of the memory system 100 determines a magnitude by which the read bias is adjusted will be described.

An embodiment in which the memory controller 120 uses a standard deviation of a threshold voltage distribution to determine the magnitude of increasing or decreasing a value of a read bias will be described.

When the standard deviation of the threshold voltage distribution is smaller, the threshold voltage distribution may be concentrated in a narrow range of voltages. Accordingly, even if a variation in the read bias is small, the number of data bits having a value to be corrected may increase.

On the other hand, when the standard deviation of the threshold voltage distribution is larger, the threshold voltage distribution may be spread over a wide range of voltages. Accordingly, compared to when the threshold voltage distribution is concentrated in a narrow range of voltages, a variation in the read bias for correcting the same number of data bits should be larger.

In the embodiments of the present disclosure, the memory controller 120 may determine a magnitude in which the read bias is updated based on a first standard deviation and a second standard deviation.

The first standard deviation is an expected standard deviation of a threshold voltage distribution of a memory cell having a value of 1 among the target memory cells.

The second standard deviation is an expected standard deviation of a threshold voltage distribution of a memory cell having a value of zero among the target memory cells.

The reason why each of the first standard deviation and the second standard deviation is the expected standard deviation is that the first standard deviation and the second standard deviation are not values that are directly calculated from the threshold voltage distribution of the current target memory cells.

When the memory controller 120 calculates a standard deviation using all threshold voltage distributions of the target memory cells, it takes a lot of time. Thus, at a specific time point (e.g., when the performance of the memory device 110 is tested or when the memory device 110 is in an idle state), the memory controller 120 may pre-calculate the standard deviation of the threshold voltage distribution according to a state (e.g., temperature, program-erase count, retention time, or combinations thereof). Next, when updating the read bias, the memory controller 120 may determine that a standard deviation of a current threshold voltage distribution is an expected standard deviation based on a current state.

The first standard deviation and the second standard deviation are values that can be applied under the assumption that the threshold voltage distribution of the target memory cell is distributed according to a predetermined model (e.g. Gaussian model).

Figure 10:
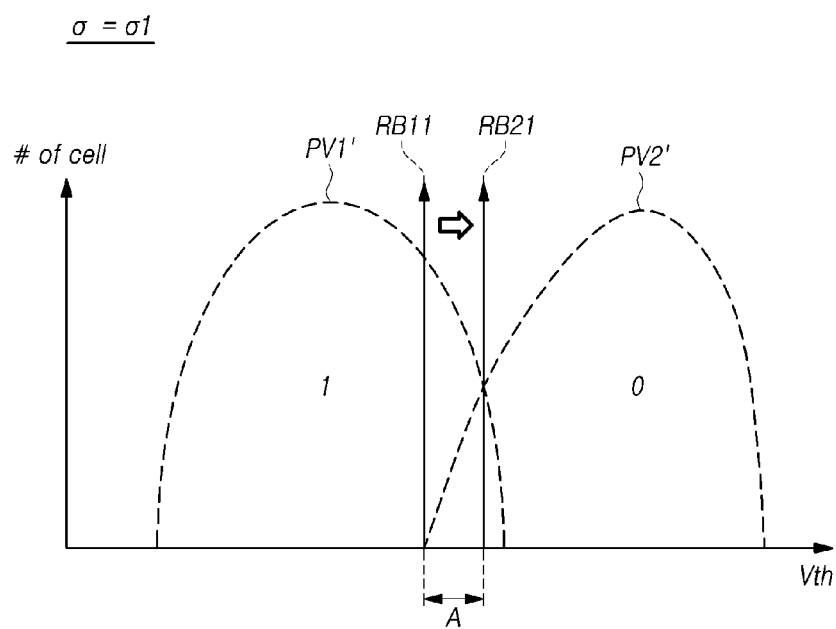
FIG. 10 illustrates an example in which a memory system according to embodiments of the present disclosure determines a magnitude in which a read bias is updated according to a standard deviation.
Figure 11:
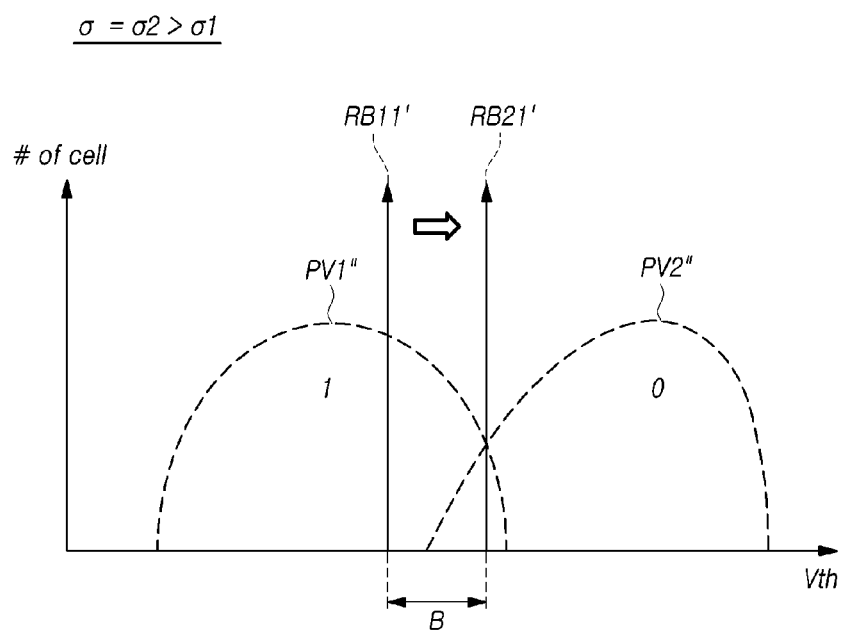
FIG. 11 illustrates another example in which a memory system according to embodiments of the present disclosure determines a magnitude in which a read bias is updated according to a standard deviation.

Hereinafter, FIGS. 10 to 11 illustrate an example in which a magnitude by which the read bias is updated is determined according to a standard deviation.

FIG. 12 illustrates an example in which the memory controller 120 determines a standard deviation of a threshold voltage distribution among a plurality of standard deviations included in a target standard deviation list.

FIG. 10 is a diagram illustrating an example in which the memory system 100 according to embodiments of the present disclosure determines a magnitude in which a read bias is updated according to a standard deviation.

In FIG. 10, a threshold voltage distribution of a memory cell having a value of 1 is determined to be PV1' and a threshold voltage distribution of a memory cell having a value of 0 is determined to be PV2'.

FIG. 10 illustrates a case where a value of a standard deviation σ of the threshold voltage distribution PV1' is equal to a first value σ1.

In FIG. 10, when the read bias is updated from RB11 to RB21, a magnitude in which the read bias is updated is referred to as A.

FIG. 11 is a diagram illustrating another example in which the memory system 100 according to embodiments of the present disclosure determines a magnitude by which a read bias is updated according to a standard deviation.

In FIG. 11, a threshold voltage distribution of a memory cell having a value of 1 is determined to be PV1" and a threshold voltage distribution of a memory cell having a value of 0 is determined to be PV2".

FIG. 11 illustrates a case where a value of a standard deviation σ of the threshold voltage distribution PV1" is equal to a second value σ2 greater than the first value σ1.

Because the standard deviation σ in FIG. 11 has the second value σ2 that is greater than the first value σ1 that the standard deviation σ had FIG. 11, when the read bias is updated from RB11' to RB21', a magnitude B by which the read bias is updated in FIG. 11 is larger than the magnitude A of the update in FIG. 10.

Meanwhile, the memory controller 120 may determine the above-described first standard deviation and second standard deviation among a plurality of standard deviations included in the expected standard deviation group. The plurality of standard deviation values included in the expected standard deviation group may be predetermined values or values calculated by the memory controller 120 at a specific time point (e.g., when the memory device 110 is in an idle state).

The memory controller 120 may determine the first standard deviation and the second standard deviation from the expected standard deviation group according to predetermined criteria.

For example, the memory controller 120 may determine the first standard deviation and the second standard deviation from the predicted standard deviation group based on a program-erase count for the target memory cell TGT_MC, a retention time for the target memory cell TGT_MC, or both.

The program-erase count for the target memory cell TGT_MC is information indicating how many times a memory block including the target memory cell TGT_MC has been programmed and then erased from a predetermined reference time point. As the program-erase count for the target memory cell TGT_MC increases, the threshold voltage distribution of the target memory cell TGT_MC deteriorates so that the magnitude of the standard deviation increases.

The retention time for the target memory cell TGT_MC is information indicating how much time has passed since the target memory cell TGT_MC was programmed. As the retention time for the target memory cell TGT_MC increases, the threshold voltage distribution of the target memory cell TGT_MC deteriorates so that the magnitude of the standard deviation increases.

FIG. 12 is a diagram illustrating an example in which the memory system 100 according to embodiments of the present disclosure determines a standard deviation according to a program-erase count and a retention time.

Referring to FIG. 12, a standard deviation may be determined according to a range to which a value of the program-erase count belongs and a range to which a value of the retention time belongs. At this time, the unit of the retention time is seconds (s). Rows in FIG. 12 correspond to program-erase count ranges, and columns in FIG. 12 correspond to retention time ranges.

For example, when the value of a program-erase count for a target memory cell is 13 and the value of a retention time for the target memory cell is 25 seconds, the standard deviation may be determined as 0.28 corresponding to a range P2 to which a value of 13 of the program-erase count belongs and a range R3 to which a value of 25 seconds of the retention time belongs.

As another example, when the value of the program-erase count for the target memory cell is 8 and the value of the retention time for the target memory cell is 37 seconds, the standard deviation may be determined as 0.25 corresponding to a range P1 to which a value of 8 of the program-erase count belongs and a range R4 to which a value of 37 seconds of the retention time belongs.

In FIGS. 6 to 12, a case where the memory controller 120 updates one read bias has been described.

Hereinafter, details to be considered when the memory controller 120 updates a plurality of read biases will be described.

When a target memory cell TGT_MC is other than a single-level cell SLC (such as when the target memory cell TGT_MC is an MLC, TLC, QLC, or the like), in embodiments, the read bias of the target memory cell TGT_MC may not be able to be updated based only on the above-described ratio of the result data RESULT DATA to the number of corrected data bits.

Figure 13:
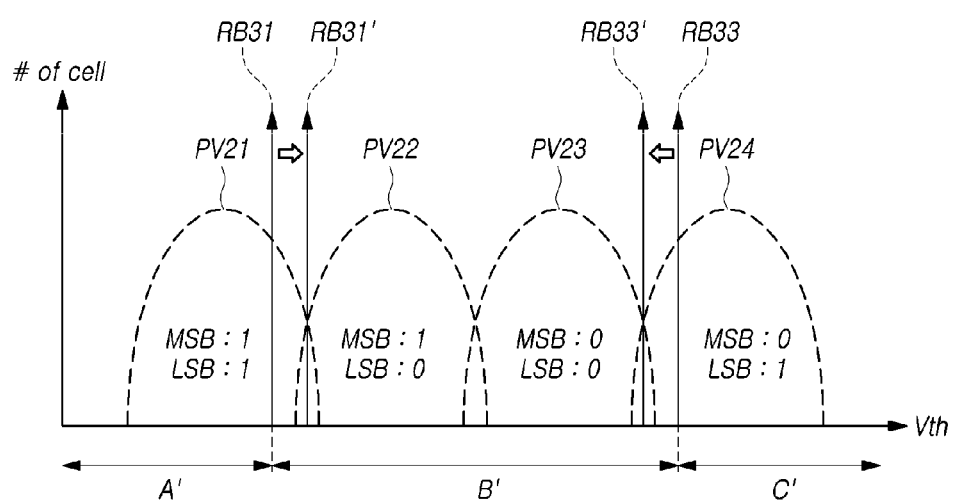
FIG. 13 illustrates an example in which a memory system according to embodiments of the present disclosure updates a plurality of read biases.
Figure 14:
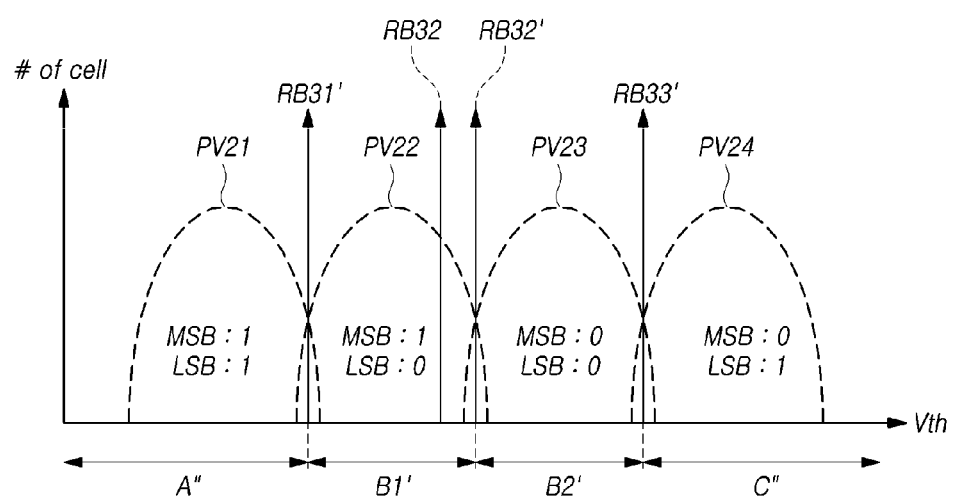
FIG. 14 illustrates an example in which the memory system of FIG. 13 updates a plurality of read biases using additional information.

Hereinafter, FIGS. 13 to 14 illustrate an example in which the read bias is updated when the target memory cell TGT_MC is the multi-level cell MLC.

FIG. 13 is a diagram illustrating an example in which the memory system 100 according to embodiments of the present disclosure updates a plurality of read biases.

In FIG. 13, the target memory cell TGT_MC may have four threshold voltage distributions PV21, PV22, PV23, and PV24.

A memory cell included in the threshold voltage distribution PV21 is a memory cell in which a most significant bit (MSB) is programmed as 1 and a least significant bit (LSB) is programmed as 1. A memory cell included in the threshold voltage distribution PV22 is a memory cell in which the MSB is programmed as 1 and the LSB is programmed as 0. A memory cells included in the threshold voltage distribution PV23 is a memory cell in which the MSB is programmed as 0 and the LSB is programmed as 0. A memory cell included in the threshold voltage distribution PV24 is a memory cell in which the MSB is programmed as 0 and the LSB is programmed as 1.

The memory controller 120 reads an LSB among data bits of 2 bits from the plurality of target memory cells TGT_MC.

In FIG. 13, when the threshold voltage of the memory cell is less than a read bias RB31 or the threshold voltage of the memory cell is greater than a read bias RB33, the LSB of the memory cell is read as 1. In this case, the threshold voltage of the memory cell in which the LSB is programmed as 1 may be included in the threshold voltage distribution PV21 or the threshold voltage distribution PV24.

In this case, the memory controller 120 may not be able to determine how to update the read bias RB31 and the read bias RB33 based only on information on the number of data bits having an LSB of 1 and the number of corrected data bits among the result data RESULT_DATA. This is because the memory cell may be included in the threshold voltage distribution PV21 but may have a threshold voltage greater than the read bias RB31, or the memory cell may be included in the threshold voltage distribution PV24 but may have a threshold voltage smaller than the read bias RB33.

Accordingly, the memory controller 120 may update the read biases RB31 and RB33 using information obtained by dividing the result data RESULT_DATA into i) a data bit group corresponding to the read bias RB31 and ii) a data bit group corresponding to the read bias RB33. In this case, the above-described divided information may be generated by the memory device 110 as part of a process of reading data from the target memory cell TGT_MC.

In this case, a group of data bits read based on the read bias RB31 may be used to update the read bias RB31 to RB31', and a group of data bits read based on the read bias RB33 may be used to update the read bias RB33 to RB33'. The method of determining the magnitude and direction in which the read biases RB31 and RB33 are updated is otherwise the same as the method described above with reference to FIGS. 6 to 12.

For example, it is assumed that the number of data bits having an LSB of 1 among the result data RESULT_DATA is 1000. If the memory controller 120 obtains, from the memory device 110, first information indicating that the number of bits of a data bit group corresponding to the read bias RB31 is 400 and the number of corrected data bits among those 400 bits is 5, and second information indicating that the number of bits of a data bit group corresponding to the read bias RB33 is 600 and the number of corrected data bits among those 600 bits is 10, the read bias RB31 may be updated based on the first information and the read bias RB33 may be updated based on the second information.

In this case, in order for the memory controller 120 to accurately update the read bias RB31, information about the number of memory cells included in the threshold voltage distribution PV22 (that is, the number of cells programmed with an MSB of 1 and an LSB of 0) is additionally required. In addition, in order for the memory controller 120 to accurately update the read bias RB33, information about the number of memory cells included in the threshold voltage distribution PV23 (that is, the number of cells programmed with an MSB of 0 and an LSB of 0) is additionally required.

However, the threshold voltage of the memory cell having an LSB of 0 may be included in the threshold voltage distribution PV22 or may be included in the threshold voltage distribution PV23. Therefore, the memory controller 120 may not be able to determine the number of memory cells included in the threshold voltage distribution PV22 and the number of memory cells included in the threshold voltage distribution PV23 from only the number of memory cells having an LSB of 0.

In this case, in an embodiment, the memory controller 120 may assume that the number of memory cells included in the threshold voltage distribution PV22 and the number of memory cells included in the threshold voltage distribution PV23 are the same.

In another embodiment, the memory controller 120 may obtain additional information for determining the number of memory cells included in the threshold voltage distribution PV22 and the number of memory cells included in the threshold voltage distribution PV23.

FIG. 14 is a diagram illustrating an example in which the memory system 100 of FIG. 13 updates a plurality of read biases using additional information.

In FIG. 14, the memory controller 120 may read MSBs for the plurality of target memory cells TGT_MC to obtain additional information about the number of memory cells having an MSB of 1 and the number of memory cells having an MSB of 0. For example, the memory controller 120 may obtain this information from the memory device 110.

The number of memory cells included in the threshold voltage distribution PV22 may be obtained by excluding the number of memory cells having an LSB of 1, that is, the number of data bits included in the data bit group corresponding to the read bias RB31, from the number of memory cells having an MSB of 1.

Similarly, the number of memory cells included in the threshold voltage distribution PV23 may be obtained by excluding the number of memory cells having an LSB of 1, that is, the number of data bits included in the data bit group corresponding to the read bias RB33, from the number of memory cells having an MSB of 0.

In the above example, if the number of memory cells having an MSB of 1 is 900 and the number of memory cells having an MSB of 0 is 950, then the number of memory cells included in the threshold voltage distribution PV22 is 900−400=500 and the number of memory cells included in the threshold voltage distribution PV23 is 950−600=350.

Accordingly, the memory controller 120 may determine the number of memory cells included in the threshold voltage distribution PV22 and the number of memory cells included in the threshold voltage distribution PV23, and may therefore accurately update the above-described read bias RB31 and read bias RB33.

In addition, the memory controller 120 may use the number of memory cells included in the threshold voltage distribution PV22 and the number of memory cells included in the threshold voltage distribution PV23 and the number of data bits having a corrected MSB to update the read biases RB32 to RB32'.

In the above, a specific operation when the memory system 100 updates the read bias in the embodiments of the present disclosure has been described.

Hereinafter, time points at which the memory system 100 updates the read bias in embodiments of the present disclosure will be described.

Figure 15:
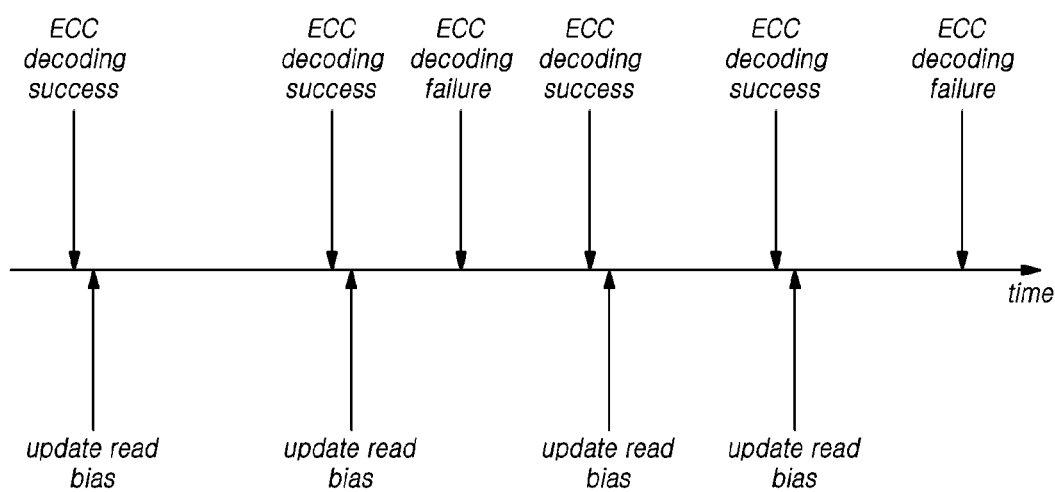
FIG. 15 illustrates an example of time points at which a memory system according to an embodiment of the present disclosure updates a read bias.

FIG. 15 illustrates time points at which the memory system 100 according to an embodiment of the present disclosure updates a read bias.

The memory controller 120 may determine to update the read bias every time ECC decoding succeeds. When the ECC decoding fails, the memory controller 120 does not update the read bias. Instead, the memory controller 120 may always update the read bias every time the ECC decoding succeeds, thereby maintaining the read bias in an optimized state.

However, in this case, the overhead required for the memory controller 120 to update the read bias may increase.

Therefore, even if the ECC decoding succeeds, the memory controller 120 may update the read bias only when it is determined that a currently configured read bias value is incorrect and there is a high possibility that the ECC decoding will fail later.

Figure 16:
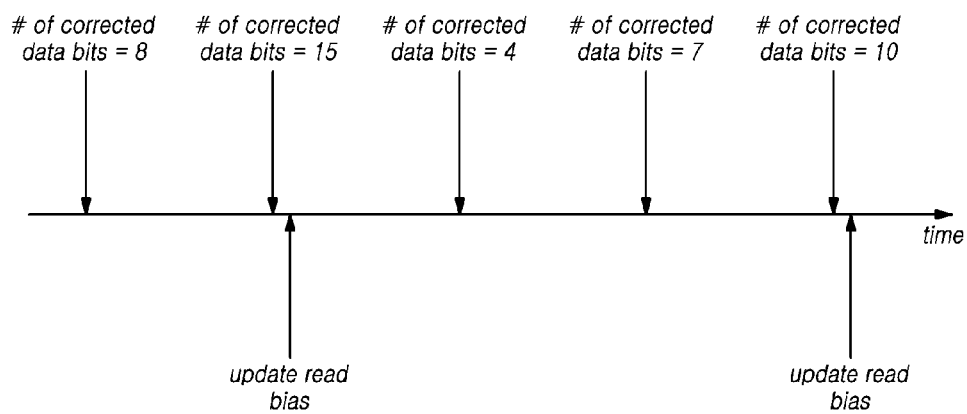
FIG. 16 illustrates an example of time points at which a memory system according to another embodiment of the present disclosure updates a read bias.

FIG. 16 illustrates time points at which the memory system 100 according to another embodiment of the present disclosure updates a read bias.

When the ECC decoding succeeds, the memory controller 120 may determine to update the read bias if the number of data bits corrected during the ECC decoding is greater than or equal to a predetermined threshold number of data bits.

If the number of corrected data bits is greater than or equal to the threshold number of data bits, the memory controller 120 may operate under the hypothesis that the number of data bits corrected during the ECC decoding became large because the currently configured read bias value is inaccurate.

In FIG. 16, it is assumed that the threshold number of data bits is configured to be 10, but embodiments are not limited thereto.

When the number of data bits corrected during initial ECC decoding is 8, the memory controller 120 does not update the read bias because 8<10.

When the number of data bits corrected during the ECC decoding thereafter is 15, the memory controller 120 may update the read bias because 15>=10. If the read bias is updated, the number of data bits corrected during the ECC decoding later may be reduced.

When the number of data bits corrected during the ECC decoding thereafter is 4, the memory controller 120 does not update the read bias because 4<10.

When the number of data bits corrected during the ECC decoding thereafter is 7, the memory controller 120 does not update the read bias because 7<10.

When the number of data bits corrected during the ECC decoding thereafter is 10, the memory controller 120 may update the read bias because 10<=10.

Figure 17:
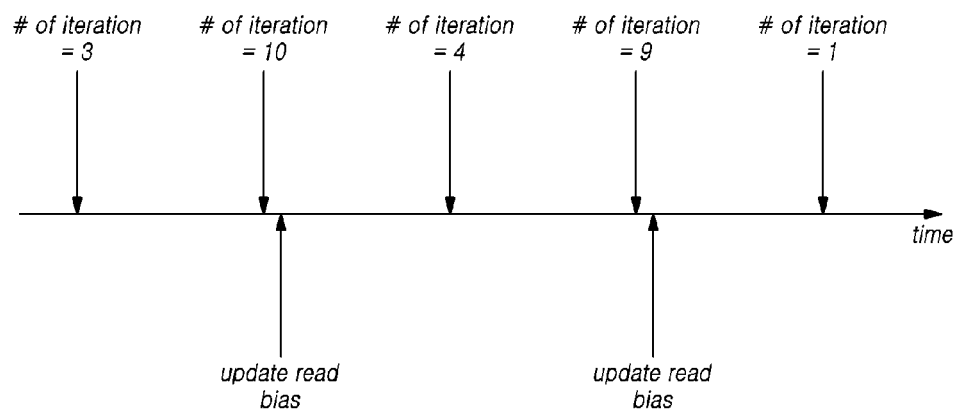
FIG. 17 illustrates an example of time points at which a memory system according to yet another embodiment of the present disclosure updates a read bias.

FIG. 17 illustrates time points at which the memory system 100 according to still another embodiment of the present disclosure updates a read bias.

When the ECC decoding succeeds, the memory controller 120 may determine to update the read bias if the number of times (iteration) a decoding operation of the ECC decoding was repeated is greater than or equal to the predetermined threshold number of iterations.

The memory controller 120 may correct some of the data bits from 1 to 0 or 0 to 1 while repeating the decoding operation until the ECC decoding succeeds during the ECC decoding or it is determined that decoding is impossible. If the number of times the decoding operation is repeated during the ECC decoding is large, the memory controller 120 may determine that the number of times the decoding operation is repeated during the ECC decoding is large because the currently configured read bias value is incorrect.

In FIG. 17, it is assumed that the threshold number of iterations is configured to be 5, but embodiments are not limited thereto.

When the number of repetitions of the decoding operation is 3 during initial ECC decoding, the memory controller 120 does not update the read bias because 3<5.

When the number of repetitions of the decoding operation is 10 during the ECC decoding thereafter, the memory controller 120 may update the read bias because 10>=5.

When the number of repetitions of the decoding operation is 4 during the ECC decoding thereafter, the memory controller 120 does not update the read bias because 4<5.

When the number of repetitions of the decoding operation is 9 during the ECC decoding thereafter, the memory controller 120 may update the read bias because 9>=5.

When the number of repetitions of the decoding operation is 1 during the ECC decoding thereafter, the memory controller 120 does not update the read bias because 1<5.

Figure 18:
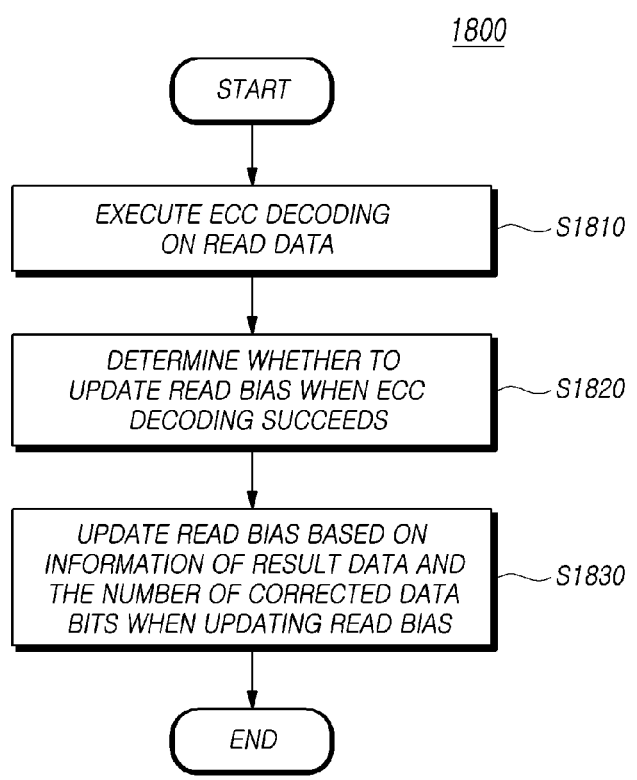
FIG. 18 illustrates a process of operating a memory system according to embodiments of the present disclosure.

FIG. 18 is a flowchart illustrating a process 1800 of operating the memory system 100 according to embodiments of the present disclosure.

In operation S1810, the process 1800 of operating the memory system 100 performs ECC decoding on read data read from a plurality of target memory cells included in the memory device 110.

In operation S1820, when the ECC decoding succeeds, the process 1800 determines whether to update one or more read biases used for reading data programmed in the plurality of target memory cells.

In operation S1830, when updating the read bias, the process 1800 updates the read bias based on information regarding: i) result data RESULT_DATA generated by the ECC decoding and ii) the number of data bits corrected during the ECC decoding.

In operation S1830, the memory system 100 may determine a direction in which the read bias is updated based on a first fail bit rate and a second fail bit rate. The first fail bit rate may be determined as a ratio of the number of data bits having a value of 1 among the result data RESULT_DATA to the number of data bits having a value corrected from 0 to 1 during the ECC decoding. The second fail bit rate may be determined as a ratio of the number of data bits having a value of 0 among the result data RESULT_DATA to the number of data bits having a value corrected from 1 to 0 during the ECC decoding.

In operation S1830, the memory system 100 may determine a magnitude in which the read bias is updated based on a first standard deviation and a second standard deviation. In this case, the first standard deviation may be an expected standard deviation for a threshold voltage distribution of a memory cell having a value of 1 among the plurality of target memory cells, and the second standard deviation may be an expected standard deviation for a threshold voltage distribution of a memory cell having a value of zero among the target memory cells.

In an embodiment, the memory system 100 may determine the first standard deviation and second standard deviation from a plurality of standard deviations included in a predicted standard deviation group based on a program-erase count for a target memory cell, a retention time for the target memory cell, or both.

The operation of the memory controller 120 described above may be controlled by the control circuit 123, and may be performed in a manner in which the processor 124 executes (drives) firmware in which various operations of the memory controller 120 are programmed.

Figure 19:
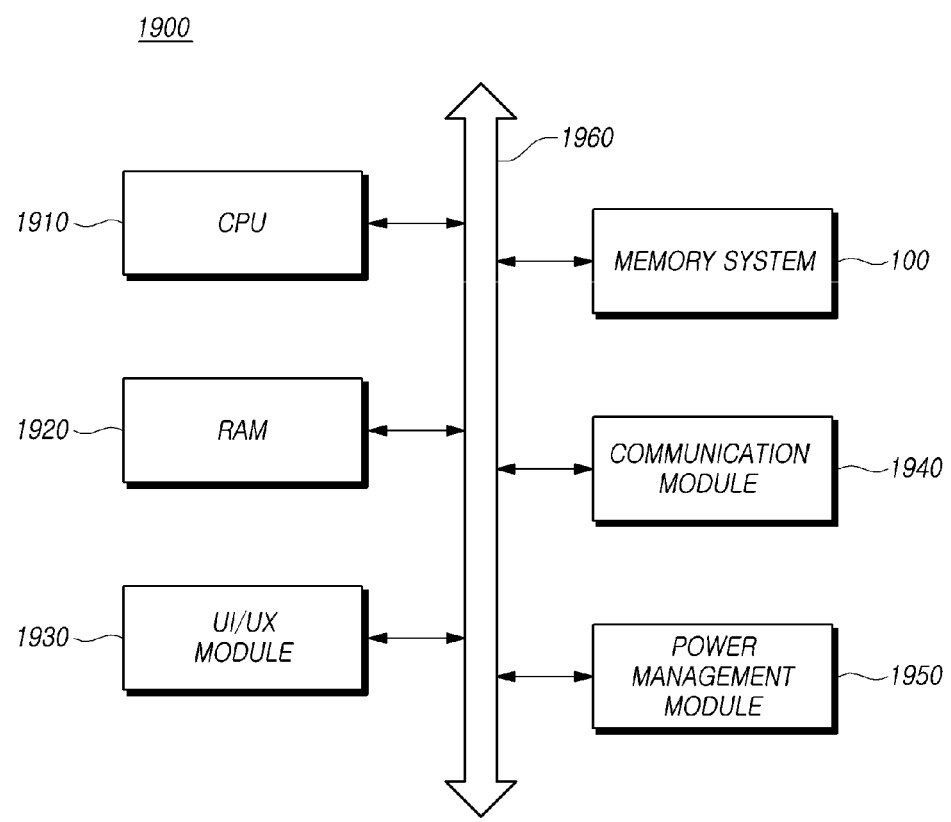
FIG. 19 illustrates the configuration of a computing system according to an embodiment of the present disclosure.

FIG. 19 is a diagram illustrating the configuration of a computing system 1900 according to an embodiment of the present disclosure.

Referring to FIG. 19, the computing system 1900 according to an embodiment of the present disclosure may include: a memory system 100 electrically connected to a system bus 1960; a CPU 1910 configured to control the overall operation of the computing system 1900; a RAM 1920 configured to store data and information related to operations of the computing system 1900; a user interface/user experience (UI/UX) module 1930 configured to provide the user with a user environment; a communication module 1940 configured to communicate with an external device in a wired and/or wireless type; and a power management module 1950 configured to manage power used by the computing system 1900.

The computing system 1900 may be a personal computer (PC) or may include a mobile terminal such as a smartphone, a tablet or various electronic devices.

The computing system 1900 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

According to embodiments of the present disclosure described above, the operation delay time of the memory system may be minimized by reducing a number of bits that need to be corrected by an ECC decoder. In addition, according to an embodiment of the present disclosure, an overhead occurring in the process of calling a specific function may be minimized. Although various embodiments of the present disclosure has been described for illustrative purposes, those skilled in the art will appreciate that various modifications, additions and substitutions are possible, without departing from the scope and spirit of the disclosure as disclosed in the accompanying claims. Therefore, embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:
1. A memory system comprising:
a memory device; and
a memory controller configured to control the memory device, wherein the memory controller:
performs Error Correcting Code (ECC) decoding on read data read from a plurality of target memory cells included in the memory device, and
in response to the ECC decoding succeeding:
determines whether to update one or more read biases used for reading data programmed in the plurality of target memory cells, and
in response to determining to update the one or more read biases, updates a read bias of the one or more read biases based on information regarding: i) result data generated by the ECC decoding and ii) a number data bits corrected during the ECC decoding, and
wherein the memory controller determines a direction in which the read bias is updated based on a first fail bit rate and a second fail bit rate when updating the read bias.
2. The memory system of claim 1, wherein the memory controller
determines the first fail bit rate as a ratio of the number of data bits having a value of 1 among the result data to the number of data bits having a value corrected from 0 to 1 during the ECC decoding, and
determines the second fail bit rate as a ratio of the number of data bits having a value of 0 among the result data to the number of data bits having a value corrected from 1 to 0 during the ECC decoding.

3. The memory system of claim 2, wherein
the memory controller determines a magnitude by which the read bias is updated based on a first standard deviation and a second standard deviation when updating the read bias,
the first standard deviation is an expected standard deviation for a threshold voltage distribution of a memory cell having a value of 1 among the target memory cells, and
the second standard deviation is an expected standard deviation for a threshold voltage distribution of a memory cell having a value of zero among the target memory cells.
4. The memory system of claim 3, wherein the memory controller determines the first standard deviation and the second standard deviation from among a plurality of standard deviations included in an expected standard deviation group based on a program-erase count of the target memory cells, a retention time of the target memory cells, or both.
5. The memory system of claim 1, wherein when the number of read biases is more than one, the memory controller updates each of the read biases based on information obtained by dividing the result data into a plurality of data bit groups corresponding to each read bias when updating that read bias.
6. The memory system of claim 1, wherein the memory controller determines to update the read bias every time the ECC decoding succeeds.
7. The memory system of claim 1, wherein the memory controller determines to update the read bias in response to the number of data bits corrected during the ECC decoding being greater than or equal to a predetermined threshold number of data bits.
8. The memory system of claim 1, wherein the memory controller determines to update the read bias in response to a number of iterations of a decoding operation during the ECC decoding being greater than or equal to a predetermined threshold number of iterations.
9. A memory controller comprising:
a memory interface configured to communicate with a memory device; and
a control circuit configured to control the memory device, wherein the control circuit:
performs Error Correcting Code (ECC) decoding on read data read from a plurality of target memory cells included in the memory device, and
in response to the ECC decoding succeeding:
determines whether to update one or more read biases used for reading data programmed in the plurality of target memory cells, and
in response to determining to update the one or more read biases, updates a read bias of the one or more read biases based on information regarding: i) result data generated by the ECC decoding and ii) a number data bits corrected during the ECC decoding, and
wherein the control circuit determines a direction in which the read bias is updated based on a first fail bit rate and a second fail bit rate, when updating the read bias.
10. The memory controller of claim 9, wherein the control circuit:
determines the first fail bit rate as a ratio of the number of data bits having a value of 1 among the result data to the number of data bits having a value corrected from 0 to 1 during the ECC decoding, and
determines the second fail bit rate as a ratio of the number of data bits having a value of 0 among the result data to the number of data bits having a value corrected from 1 to 0 during the ECC decoding.

11. The memory controller of claim 10, wherein
the memory controller determines a magnitude by which the read bias is updated based on a first standard deviation and a second standard deviation when updating the read bias,
the first standard deviation is an expected standard deviation for a threshold voltage distribution of a memory cell having a value of 1 among the target memory cells, and
the second standard deviation is an expected standard deviation for a threshold voltage distribution of a memory cell having a value of zero among the target memory cells.

12. The memory controller of claim 11, wherein the control circuit determines the first standard deviation and the second standard deviation from among a plurality of standard deviations included in an expected standard deviation group based on a program-erase count of the target memory cells, a retention time of the target memory cells, or both.

13. A method of operating a memory system, the method comprising:
  successfully performing Error Correcting Code (ECC) decoding on read data read from a plurality of target memory cells included in a memory device; and
  in response to the ECC decoding succeeding:
    determining whether to update one or more read biases used for reading data programmed in the plurality of target memory cells, and
    in response to determining to update the one or more read biases, updating a read bias of the one or more read biases based on information regarding: i) result data generated by the ECC decoding and ii) a number data bits corrected during the ECC decoding,
  wherein updating of the read bias comprises determining a direction in which the read bias is updated based on a first fail bit rate and a second fail bit rate, when updating the read bias.

14. The method of claim 13, wherein updating of the read bias comprises:
  determining the first fail bit rate as a ratio of the number of data bits having a value of 1 among the result data to the number of data bits having a value corrected from 0 to 1 during the ECC decoding, and
  determining the second fail bit rate as a ratio of the number of data bits having a value of 0 among the result data to the number of data bits having a value corrected from 1 to 0 during the ECC decoding.

15. The method of claim 14,
  wherein updating of the read bias comprises determining a magnitude by which the read bias is updated based on a first standard deviation and a second standard deviation when updating the read bias,
  wherein the first standard deviation is an expected standard deviation for a threshold voltage distribution of a memory cell having a value of 1 among the target memory cells, and
  wherein the second standard deviation is an expected standard deviation for a threshold voltage distribution of a memory cell having a value of zero among the target memory cells.

16. The method of claim 15, wherein updating of the read bias comprises
  determining the first standard deviation and the second standard deviation from among a plurality of standard deviations included in an expected standard deviation group based on a program-erase count of the target memory cells, a retention time of the target memory cells, or both.

* * * * *